United States Patent [19]

Normandin et al.

[11] Patent Number: 5,111,466

[45] Date of Patent: May 5, 1992

[54] OPTICAL MULTILAYER STRUCTURES FOR HARMONIC LASER EMISSION

[75] Inventors: Richard J. F. Normandin, Ottawa; Sylvie Letourneau, Les Saules; Francoise Chatenoud, Fleury d'Aude; Robin L. Williams, Orleans, all of Canada

[73] Assignee: National Research Council of Canada, Ottawa, Canada

[21] Appl. No.: 667,494

[22] Filed: Mar. 11, 1991

[30] Foreign Application Priority Data

Oct. 25, 1990 [CA] Canada .................................. 2028506

[51] Int. Cl.[5] ............................ H01S 3/10; H03F 7/00
[52] U.S. Cl. ...................................... 372/22; 356/326; 359/328; 385/131
[58] Field of Search .................... 307/427; 372/21, 22; 356/326; 359/326, 328; 385/129, 130, 131

[56] References Cited

U.S. PATENT DOCUMENTS 5,051,617 9/1991 Normandin et al. ................ 359/328

Primary Examiner—James W. Davie
Attorney, Agent, or Firm—Yoshiharu Toyooka

[57] ABSTRACT

Optical multilayer structures for harmonic laser emission are disclosed. The multilayer structures are made of plurality of layers of different optically nonlinear semiconductor materials. The thicknesses, locations and refractive indices of the layers are designed, according to a modified Fourier transform, to give a broad bandwidth for interaction of fundamental light fields. Various applications are envisioned and described, e.g. spectrometers, non-blocking switching systems, wavelength division multiplexing fiber optic receivers etc.

9 Claims, 3 Drawing Sheets

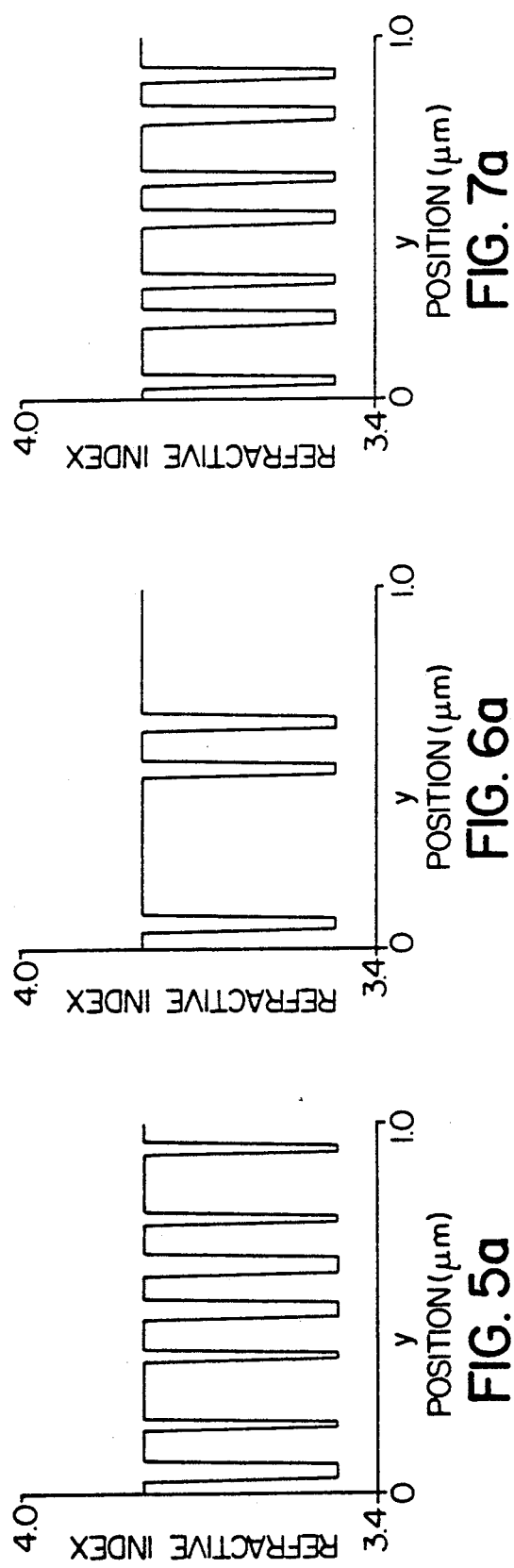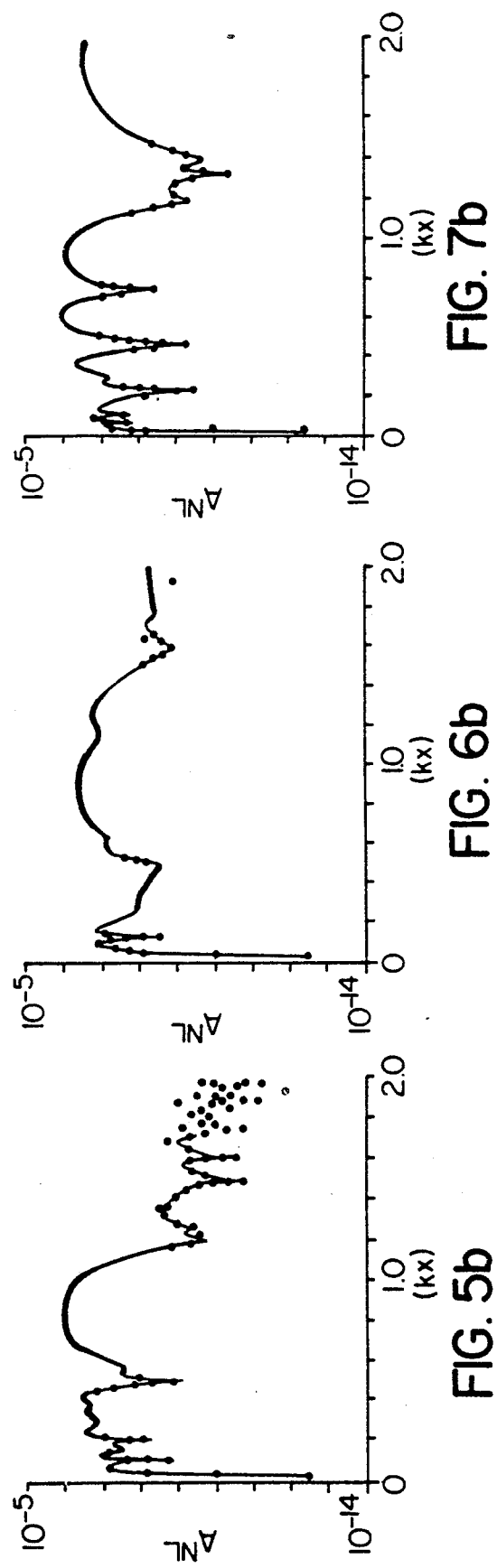

OPTICAL MULTILAYER STRUCTURES FOR HARMONIC LASER EMISSION

FIELD OF THE INVENTION

The present invention relates to optical multilayer structures for harmonic laser emission by contra-propagating light fields. More specifically, it is directed to optical multilayered waveguide structures which are made of a plurality of thin parallel layers of optically nonlinear materials. The locations, the thicknesses and refractive indices of the layers are designed to achieve a desired bandwidth of interaction according to a predetermined modified Fourier transform.

BACKGROUND OF THE INVENTION

In Optics Letters, Vol. 4, No. 2, February 1979, pp. 58-59, R. Normandin (the present inventor) et al, reported the nonlinear mixing of oppositely propagating guided waves. The resultant field was coupled to radiation modes and propagated in a direction perpendicular to the waveguide surface, in the case of equal frequency fundamentals. In subsequent articles, its application to picosecond signal processing, the creation of all optical transient digitizers and spectrometers demonstrated the potential usefulness of this work. (See Appl. Phys. Lett. 36(4), 15 Feb. 1980, pp. 253-255 by R. Normandin et al; 40(9),1982, pp. 759-761 by R. Normandin et al, and "Integrated Optical Circuits and Components" edited by L. D. Hutcheson, Dekker Inc. New York, U.S.A., Chapter 9, by G. I. Stegeman et al.) The overlap of the two oppositely propagating fields will give rise to a nonlinear polarization source at the sum frequency. In bulk media such a process is nonradiative due to the simultaneous requirement of energy and momentum conservation in all directions. This is not the case in a waveguide geometry.

Unfortunately since the waves do not grow with distance (no phase matching) the resultant fields are much weaker than that obtained in a traditional second harmonic generation device. Therefore, this nonlinear interaction has remained largely a laboratory curiosity. However, the applicant's copending application Ser. No. 07/545,497 filed on June 26, 1990, now U.S. Pat. No. 5,051,617, describes successful ways of increasing this interaction by factor of $10^7$ and obtaining efficient conversion in the visible region. As mentioned in the copending application, with presently available diode laser sources, most of the visible spectrum can be reached. Ultrafast subpicosecond samplers and monolithic high resolution spectrometers are possible in the context of fiber optics communication systems and optoelectronic integrated circuitry.

Further research has been conducted on the multilayer structures. Various parameters have been considered, e.g. refractive index, thickness and location of layers etc. in order to improve the interaction bandwidth so that wider application fields can be envisaged.

OBJECTS OF THE INVENTION

It is therefore an object of the present invention to provide an optical multilayer structure for harmonic laser emission having a broad interaction bandwidth.

It is a further object of the present invention to provide an optical multilayer structure whose layers are designed according to a modified Fourier transform.

It is another object of the present invention to provide a spectrometer which includes an optical multilayer structure according to another embodiment of the present invention.

It is yet a further object of the present invention to provide an optical multilayer structure having an on-board laser according to a yet further embodiment of the invention.

SUMMARY OF THE INVENTION

Briefly stated, a broad bandwidth optical multilayer structure for harmonic laser emission according to the present invention includes an optical waveguide for propagating light in one dimension under a guiding condition. The waveguide is made of more than one layer of an optically non-linear semiconductor materials and all the layers are parallel to the dimension. Light injection means are provided for injecting into the waveguide along the dimension contra-propagating lights of fundamental wavelengths to produce a harmonic light in a direction different from the dimension and determined by the mutual relationship of the contra-propagating lights. The locations and the thicknesses of the layers and their refractive indices are chosen approximately according to the modified Fourier transform of the following equation:

$$S = \int_{-\infty}^{\infty} \frac{P^{NL}(y')}{n(y')} \exp\{-ik_0 n(y') y'\} dy'$$

wherein
S is proportional to radiated harmonic field,
$P^{NL}(y')$ is nonlinear polarization field induced by the waveguided fundamentals,
$n(y')$ is the refractive index at position y', and
$k_0$ is the wavevector of radiated field in air
so as to provide the multilayer structure with a predetermined interaction bandwidth.

BRIEF DESCRIPTION OF THE DRAWINGS

For a more complete understanding of the present invention and for further objects and advantages thereof, references may be made to the following description taken in conjunction with the accompanying drawings in which;

FIGS. 5a, 6a and 7a show spatial profiles of multilayer structures according to further embodiments.

FIGS. 5b, 6b and 7b are graphs showing the interaction cross-sections of the multilayer structures of FIGS. 5a, 6a and 7a respectively.

DETAILED DESCRIPTION OF PREFERRED EMBODIMENTS OF THE INVENTION

Figure 1:
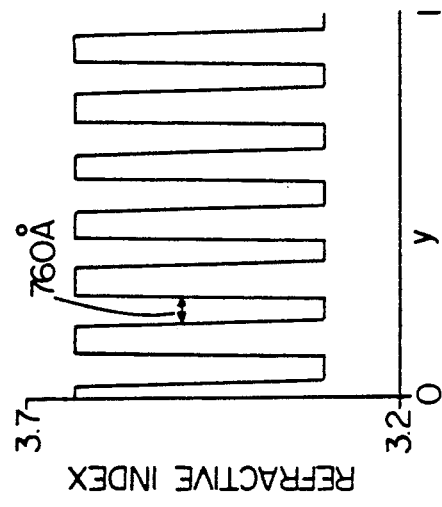
FIG. 1 is a schematic cross-sectional view of a multilayer structure.

Referring to FIG. 1, fiber optics 1 and 3 inject contra-propagating light fields into an optical multilayer structure 5 which is provided on a buffer 7 and a substrate 9. The multilayer structure is an optical waveguide which is made of more than one parallel layer of optically nonlinear semiconductor materials and is designed to propagate light field of specific wavelengths in one dimension under the guiding conditions. Interaction between the contra-propagating light fields in the multilayer structure induces a nonlinear harmonic light field 11. The direction of emission is governed by the relationship between the contra-propagating light fields, as will be discussed later.

Figure 2:
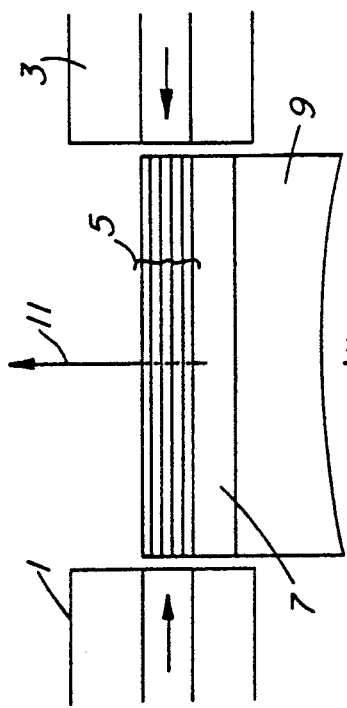
FIG. 2 is a graph showing the interaction cross-section $A^{NL}$ for GaAs and for an AlGaAs multilayer structure.

According to the applicant's aforementioned copending application, the multilayer structure was chosen to have all nonlinear field contributions add in phase in the far field. The idea is to simply modulate the phase of the radiating nonlinear field by creating regions of differing index of refraction. Thus, assuming similar nonlinear coefficients for $Al_{0.9}Ga_{0.1}As$ and $Al_{0.7}Ga_{0.3}As$, a cross section calculation was performed. The result of alternating AlGaAs layers in a waveguide is shown in FIG. 2, for a guided wavelength of 1.06 μm. The buffer layer is also made of AlGaAs. In the figure, the cross section $A^{NL}$ is shown along the vertical axis in $W^{-1}$ for a normalized interaction area of 1 mm* 1 mm and the uniform thickness of alternating layers of $Al_{0.9}Ga_{0.1}As$ and $Al_{0.7}Ga_{0.3}As$ is along the horizontal axis. Graph 21 is for the multilayer structure. Graph 23 is for a GaAs single layer and is shown for comparison.

For simplicity the strength of the nonlinear interaction is summarised in a geometry independent form as, $$I^{2\omega} = A^{NL} \cdot I_1 \cdot I_2 \quad (1)$$

wherein $I^{2\omega}$ is the nonlinear radiated light field intensity and $I_1$ and $I_2$ are the intensities of the waveguided fundamentals.

Figure 3:
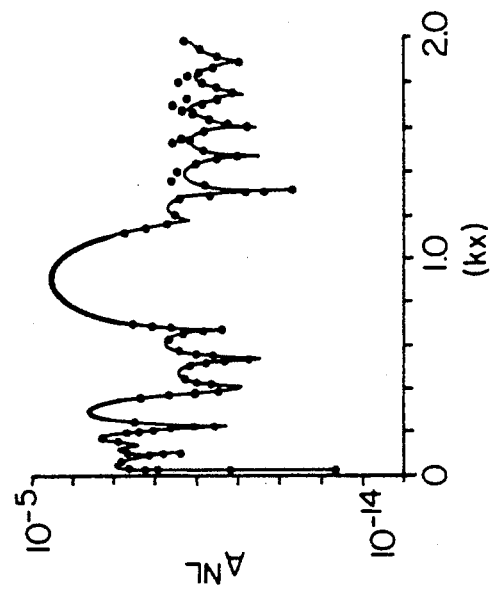
FIG. 3 shows a spatial profile of a multilayer structure according to one embodiment.

The profile of the multilayer structure in terms of the index of refraction is shown in FIG. 3. Considering that the layer spacings are at half wavelengths of the harmonic light (i.e. 600 Å or so) and that the total waveguide thickness is approximately 1 μm there cannot be many layers active in the film. How critical is the "tuning" in period for these films? Further research has been conducted along this line. The present invention is the result of this research and is therefore improvement over the aforementioned applicant's copending application.

Referring to FIGS. 3, 5a, 6a and 7a, calculations of $A^{NL}$ (cross section) were carried out by varying the period and thickness, in a 1 μm film, up to twice the optimum and the results are shown in FIGS. 4, 5b, 6b and 7b.

The multilayer structure shown in FIG. 3 is uniform in its spatial frequency. Thus the layers are alternating in a periodic and predictable manner, alternating in material composition (i.e., in index of refraction) every 640 Å for this example (1.06 μm input light in the AlGaAs multilayer film). Thus it can be said that the multilayer structure has a constant spatial frequency tuned to be in resonance with the emitted harmonic light out of the waveguide structure since the individual film spacings are at one half of the wavelength of 0.53 μm in the material when the AlGaAs refractive index is taken into account. Two things can happen to change this resonance condition. Either the film spacings are wrong in periodicity (i.e. wrong spacings, say 500 Å for example) or else, the input wavelength is at the wrong wavelength for the given structure (say 0.9 μm instead of 1.06 μm here). In both cases the efficiency of the multilayer structure will be degraded. Both situations can be treated mathematically in the same manner. A parameter called kx can be defined. kx=1 describes perfect resonance of the multilayer structure. kx=2 means the periodicity for the emitted light is off by a factor of two. This condition could be caused by either too small a layer thickness or because of a too large wavelength being emitted by the structure. It is the relative tuning that is important. Thus the x axis in FIGS. 4, 5b, 6b and 7b describes the deviation from perfect multilayer resonance (at kx=1) from kx=0 (no multilayer or infinite wavelength) to kx=2 (too small a thickness by a factor of two or too small a wavelength by a factor of two). These figures then describe what would be the interaction cross section if one were to vary the fabrication parameters such as the individual layer thicknesses from the optimum condition of kx=1.

There are two cases where this off-resonance situation becomes more complicated. In the first instance, light is emitted off axis. In this case it is obvious that when the angle of emission is changed the effective spatial periodicity of the layers is changed. For very shallow angles this is large. The effective layer tuning is then changed from the optimum value at constant light wavelength. In reality, both the emission angle and emitted wavelength are changing according to Equation 6 which will be discussed later.

The second complication deals with one of the objects of the present invention which is to create a broadband multilayer structure. This has led to further embodiments of non-periodic (or almost periodic) placement of multilayers as shown in FIGS. 5a, 6a and 7a. The refractive index of each individual layer (i.e. alloy composition for AlGaAs), the layer position in the multilayer structure and finally its thickness can all be used to modify the resonance conditions. Since they can all be related and expressed in an equivalent manner mathematically, only those examples have been chosen where only two material compositions (or alloys) were used for the waveguide and position and thicknesses were varied). It should of course be noted that a multitude of different materials, indices of refraction, thickness and positions can be considered to achieve almost any desired resonance conditions.

Figure 4:
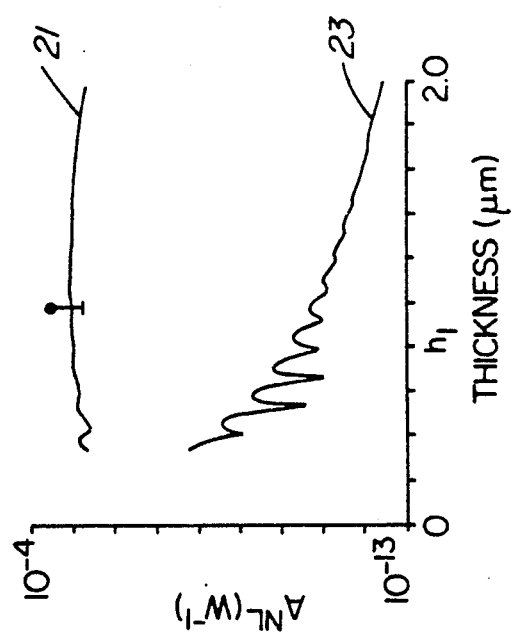
FIG. 4 is a graph showing the interaction cross-section of the multilayer structure of FIG. 3.

Therefore in the first embodiment shown in FIG. 4, half and full resonances are quite evident at kx=0.5 and kx=1.0. For kx small (i.e. large period, larger than the film thickness) the cross section is constant until the first layer reaches the film interface, as seen on the left side of the curve. Not surprisingly, the overall log curve is similar to an antenna array in aperture microwave designs, to which it is related. Of note here is the wide main resonance. Since the number of layer is small the resonance is broad. Thus the overall design is not overly sensitive to materials or layer errors.

As discussed above, research has been conducted to improve yet further the performance (particularly the interaction bandwidth) of the multilayer structures. This bandwidth consideration is critical in the fields of applications where the two contra-propagating light fields have different fundamental frequencies or in cases where a single layer stack is supposed to cover large wavelength differences in tunable laser applications. Several calculations were performed as functions of layer duty cycle, random variation in thickness and changes in index or alloy ratio. The enhancement is surprisingly stable. The results are shown in FIGS. 5b, 6b and 7b.

In order to visualize the effects of changes in layer thickness, periodicity and refractive index on the cross section, some theoretical considerations are helpful. The nonlinear response of the AlGaAs layers in the waveguides act as source terms. These radiation terms will obey Maxwell's equations (as so the guided input beams) and the radiation field at the harmonic will be a solution of the nonhomogeneous Maxwell equations. In summary form it can be shown that the overlap of the two oppositely propagating guided waves at the fundamental frequency can be written in the system shown in FIG. 1 as $$P_Z^{NL} = \epsilon_0 d_{ij} E_+(y)\{\exp(2i\omega t) + \exp(-2ikx)\} \quad (2)$$

where $d_{ij}$ is the second order harmonic coefficient, $E(y)$ the light field and $\epsilon_0$ the dielectric constant. The formal method to evaluate the harmonic radiated field is to consider a solution based on a surface Green's function approach in which each contribution is "dissected" in dipole planes of the multilayers.

$$P(y') = P_Z^{NL}(y)\delta(y - y') \quad (3)$$

where $\delta(y - y')$ is a delta function.

The contribution of each plane is added (i.e. integrated) taking into account its position and amplitude in the depth of the wavelength structure. Substitution in Maxwell's equation will lead to a solution of the form, $$P(y) = \int_{-\infty}^{\infty} P_Z^{NL}(y')\delta(y - y')dy' \quad (4)$$

to give the radiated field amplitude with a term proportional to S at the surface, where $$S = \int_{-\infty}^{\infty} \frac{P^{NL}(y')}{n(y')} \exp\{-ik_0 n(y')y'\}dy' \quad (5)$$

where
$P^{NL}(y')$: nonlinear polarization field induced by the waveguide fundamentals
$n(y')$: refractive index at position y'
$k_0$: wave vector in air (top layer)

Equation 5 reveals that with the exception of the $n(y')$ term, the overall radiated field is a Fourier transform of the polarization source term, (thus the term modified Fourier transform), that is to say, the overall radiated field is proportional to the integral of the polarization source induced in each layer. Therefore, for a given film geometry, the resultant bandwidth can be tailored for specific need by a suitable engineering of the thickness and refractive index of each individual layer forming the overall waveguide.

In the following embodiments, the desired response was modelled from its inverse Fourier transform to obtain an approximation of the needed nonlinear polarization source terms. This procedure facilitated to define the appropriate layer thickness once the material composition for the multilayers was chosen. The test structure was then recomputed with the exact form of equation 2 (i.e. with the n(y') term included). In most instances the variation in index of refraction between layers was small compared to the overall material index at the harmonic frequencies and thus the effect of the n(y') term was to change the position of the minima in the resonance curves slightly. The Fourier transform approximation is thus fairly good in the geometry of the present invention. It is also easy to find cases where the exact form of equation 2 must be used to get useful modelling.

This modified Fourier transform techniques can therefore be used to make and design multilayer nonlinear films with any desired response. In FIGS. 5a and 5b is shown the enhancements for two closely spaced spatial frequencies for the multilayer with a net widening of the bandpass. It is further widened with three spatial frequencies as shown in FIGS. 6a and 6b. Note the use of binary values for the index of refraction of the two film components instead of a full variation in index. Thus a wide array of binary multilayer coating techniques, as used in optical thin film technology, can be used here to aid in the design of the desired bandpass. A final example, with resonances at three given wavelengths, is shown in FIGS. 7a and 7b.

When the oppositely propagating guided waves are of different frequencies the direction of harmonic plane wave emission is governed by the simultaneous requirements of momentum and energy conservation for the overall interaction. This can be reduced to, $$k_i^{NL} = k_1 + k_i \quad (6)$$
$$\frac{1}{\lambda^{NL}} = \frac{1}{\lambda_1} + \frac{1}{\lambda_i}$$

$i = 1, 2, 3 \ldots,$ wherein $K_i^{NL}$ is the wave vector of the induced harmonic light and $k_1$ and $k_i$ are the wave vectors of the contra-propagating guided light fields. $\lambda_i^{NL}$, $\lambda_1$ and $\lambda_i$ are wavelengths of the respective light fields.

Figure 8:
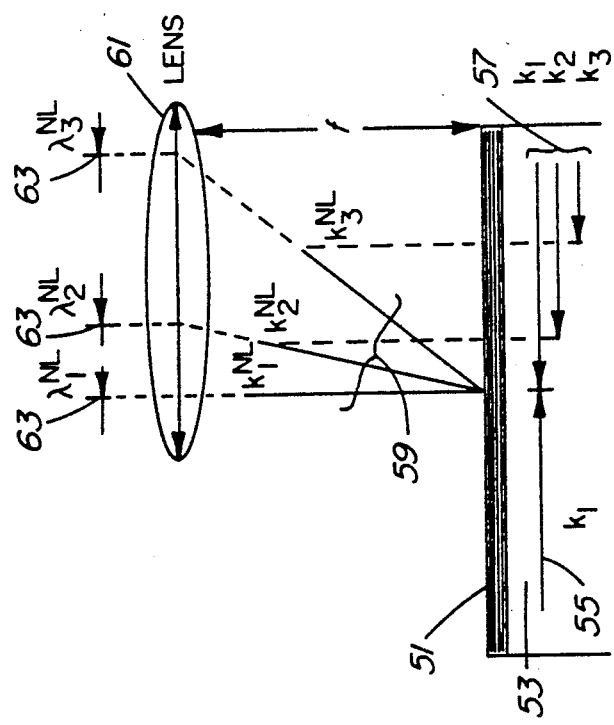
FIG. 8 is a diagrammatic illustration of a spectrographic arrangement according to a further embodiment.

In FIG. 8, a multilayer structure 51 is provided on a buffer-substrate 53. A light field with the wave vector $k_1$ designated by 55 propagates in the multilayer structure in the direction of the arrow. A contra-propagating light fields have wave vectors $k_1$, $k_2$ and $k_3$ shown collectively by 57 and propagate in the direction of the arrows. The contra-propagating light fields in this illustration have three wave vectors but could have any number of them. The induced nonlinear harmonic lights are shown collectively by 59 and have wave vectors $k_1^{NL}$, $k_2^{NL}$, $k_3^{NL}$ as the case may be. A lens 61 having a focal length f is positioned to collect radiated harmonic lights and to convert them into parallel beams of $\lambda^{NL}$, $\lambda_2^{NL}$, $\lambda_3^{NL}$ which are then directed to photodetectors 63.

It should be noted that there is also, by symmetry considerations, a mirror image field resulting in similar harmonic waves travelling in the substrate direction. These have not been included in FIG. 8. As a further embodiment, a reflecting structure at the film and substrate interface can be provided to double the effective interaction cross section.

Referring again to FIG. 8 with the relations in Equation 3, it is easy to compute the harmonic internal angle for the mixing of 1.06 $\mu$m and 1.32 $\mu$m light in the previously described sample. The harmonic wavelength is 0.588 $\mu$m in the red-orange part of the spectrum with an internal angle of 5.6°. This results in an air angle of approximately 20°.

There is however an effective detuning of the periodicity of the multilayers due to the non-normal propagation of the harmonic wavefront and thus a decrease in harmonic enhancement as the angle becomes more severe. This leads to the need of designing a wide bandwidth layer geometry. Again absolute cross section measurements were performed and found to be in good agreement with theory. For incident waveguided average powers of 1 mW, a cross section in the $10^{-5}$ was found for orange light at an angle of 22° away from the normal of the waveguide plane. Both these measurements are in close agreement with FIG. 8 and Equation 3.

Figure 9:
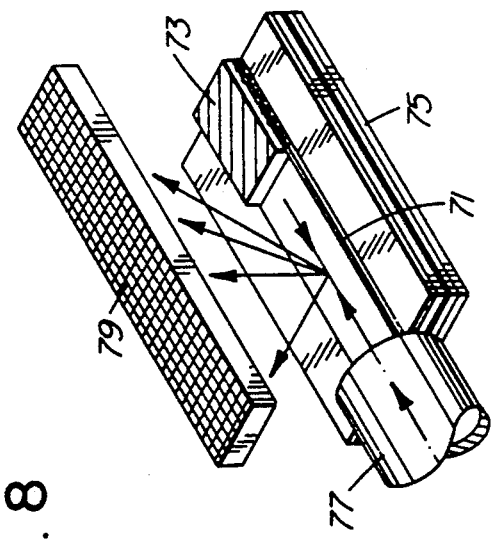
FIG. 9 is a schematic view of a spectrometer according to another embodiment.

A further embodiment of the present invention is shown schematically in FIG. 9. In this figure a multilayer structure 71 is used to form a spectrometer. The second incoming fiber has been replaced by an onboard laser source 73 which is for example a DFB (distributed feedback Bragg grating) or DBR (distributed Bragg reflector) laser stabilized to a single frequency. Common substrate and buffer layers 75 are provided with electrodes to form a DFB or DBR laser active region. A light to be measured is injected through an input fiber 77 and radiated harmonic lights are detected by a detector 79 e.g. a CCD detector array. In the geometry shown here the direction of the harmonic lights will reflect the difference in frequency between the DFB or DBR laser and the incoming unknown frequency.

Using Rayleigh's criterion, $$\frac{\lambda}{\Delta\lambda} = \frac{nL}{\lambda} \tag{7}$$

where

L is the radiating interaction length
to estimate the sensitivity of such a spectrometer with a typical interaction length of a few millimeters a 1 Å resolution is obtained. In effect a 1 mm³ device can replace a tabletop conventional grating spectrometer. Such a device is able to resolve the individual longitudinal modes of conventional diode lasers. It can be used as part of a servo-looped frequency control system or as a tunable adjustable local oscillator in coherent systems. The resolution is better than that achieved by a conventional grating spectrometer and is, in effect, programmable by changing the reference wavelength. Therefore, with several fixed detectors in the far field, multichannel detection can be reconfigured at will by switching the reference beams and adjusting them in frequency (and amplitude if the time domain is also used) to direct each channel on the desired detector position. The configuration is similar to that shown in FIG. 9 with a CCD array as a detector. The DFB or DBR laser can be variable in wavelength to meet this need.

As shown in FIG. 8, the superposition principle implies that multiple wavelengths can be separated simultaneously. Thus this device can be used as a tunable WDM demultiplexer. Since the harmonic output is the product of the two oppositely propagating guided modes it is possible to impress the modulation of one channel to the other and also achieve time domain demultiplexing and switching simultaneously with the WDM functions thus realising full bandwidth utilisation as a detector/demultiplexing for fiber systems.

Figure 10:
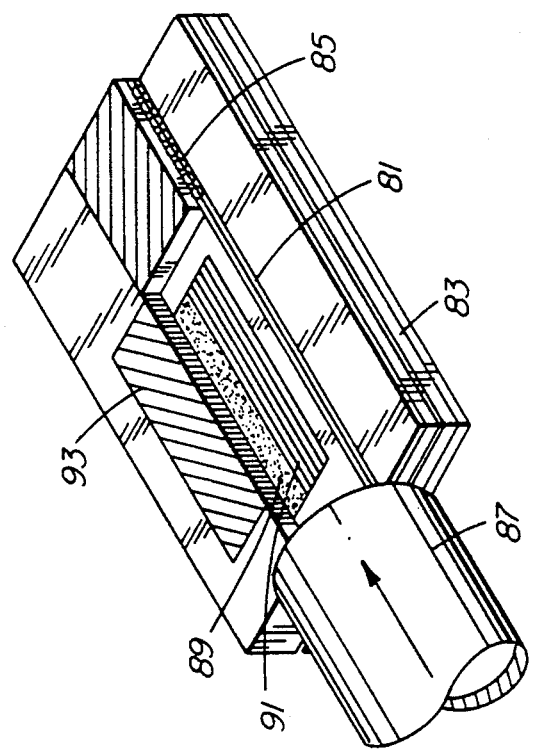
FIG. 10 illustrate schematically a WDM fiber optic receiver according to yet another embodiment.

In FIG. 10, there is illustrated schematically a WDM fiber optic receiver, according to another embodiment of the present invention, which uses a full monolithic integration of the electronic and optical components on a single substrate. In this embodiment, as that shown in FIG. 9, an optical multilayer structure 81 is provide on a substrate 83 which also carries a DFB laser 85 to inject a reference light. An input fiber 87 injects an input light into the optical multilayer structure. Surface holograms in a holographic transition 89 and ridged side amplifier channel 91 allow the use of the harmonic emission in near field. A GaAs based CCd detector array or such photodetectors 93 as well as the driving and control electronic can therefore be built out of the unetched, upper layer of the wafer and located near the multilayer structure which permits the fabrication of the complete device by monolithic integration using FIB implantantion, compatible with OEIC technology.

It should also be noted that phase information is conserved in the overall convolution and mixing operation. This is important for coherent optical fiber systems. Usually a local oscillator is mixed with the incoming coherent fiber signal onto a square law photodetector. The resultant signal then contains sidebands at microwave frequencies that are extracted by conventional electronic techniques. The same end is achieved here since the nonlinear interaction is the product of the incoming and reference guided waves. But the present invention has the advantage of also being able to separate several "carrier" wavelengths at the same time. Another point to note is that with cross sections in the $10^{-3}$ the situation where the local oscillator (i.e. reference laser) is $10^4$ times the strength of the incoming signal implies a net "gain" or amplification of the detected signal (now at the sum harmonic wavelength) by a factor of ten. This is similar to the conventional heterodyne mixing process used in coherent detection.

We claim:
1. A broad bandwidth optical multilayer structure for harmonic laser emission, comprising:
    an optical waveguide for propagating light in one dimension under a guiding condition,
    the said waveguide being made of more than one layer of an optically non-linear semiconductor materials, all the said layers being parallel to the said dimension, and
    light injection means for injecting into the said waveguide along the said dimension contra-propagating lights of fundamental wavelengths to produce a harmonic light in a direction different from the said dimension and determined by the mutual relationship of the said contra-propagating lights in that the locations and the thicknesses of the said layers and their refractive indices are chosen approximately according to the Fourier transform of the following equation:

$$S = \int_{-\infty}^{\infty} \frac{P^{NL}(y')}{n(y')} \exp\{-ik_0 n(y')y'\} dy'$$

where
    S is proportional to radiated harmonic field,
    $P^{NL}(y')$ is nonlinear polarization field induced by the waveguided fundamentals,
    $n(y')$ is the refractive index at position y', and
    $k_0$ is the wave vector of radiated field in air
so as to provide the said multilayer structure with a predetermined interaction bandwidth.

2. The broad bandwidth optical multilayer structure according to claim 1 wherein:
   the said waveguide is made of more than one layer of two optically non-linear semiconductor materials of different refractive indices, and
   the said layers have predetermined thicknesses and are located in predetermined spatial frequencies according to the Fourier transform.

3. The broad bandwidth optical multilayer structure according to claim 2 wherein:
   the said layers are located in two different spatial frequencies.

4. The broad bandwidth optical multilayer structure according to claim 1 wherein:
   the said semiconductor materials are alloys.

5. The broad bandwidth optical multilayer structure according to claim 1 wherein:
   the said waveguide further comprises a lasing cavity and a laser activating means for producing and injecting into the said waveguide one of the said contra-propagating lights of fundamental wavelength.

6. The broad bandwidth optical multilayer structure according to claim 5 wherein:
   one of the light injection means is a fiber optic coupled to one end of the said optical waveguide.

7. The broad bandwidth multilayer structure according to claim 6 wherein:
   the said lasing cavity and a laser activating means are adjustable to produce the said one of the contra-propagating lights of an adjustable fundamental wavelength.

8. An optical spectrometer for measuring the wavelength of a light comprising;
   a substrate,
   a broad bandwidth optical multilayer structure provided on said substrate for harmonic laser emission, said multilayer structure comprising:
      an optical waveguide for propagating light in one dimension under a guiding condition,
      the said waveguide being made of more than one layer of an optically non-linear semiconductor materials, all the said layers being parallel to the said dimensions, and the said waveguide further comprises a lasing cavity and a laser activating means for producing and injecting a laser light of a stable fundamental wavelength into the said waveguide in one direction along said dimension, and
   light injection means for injecting said light to be measured into the said waveguide in the opposite direction along the said dimension to produce a harmonic light in a direction different from the said dimension and determined by the mutual relationship of said laser light and light to be measured in that
   the locations and the thicknesses of the said layers and their refractive indices are chosen approximately according to the Fourier transform of the following equation:

$$S = \int_{-\infty}^{\infty} \frac{P^{NL}(y')}{n(y')} \exp\{-ik_0 n(y') y'\} dy'$$

where
   S is proportional to radiated harmonic field,
   $P^{NL}(y')$ is nonlinear polarization field induced by the waveguided fundamental,
   $n(y')$ is the refractive index at position y', and
   $k_0$ is the wave vector of radiated field in air
   so as to provide the said multilayer structure with a predetermined interaction bandwidth and
   a photodetector array to detect the said harmonic lights and determine the characteristics of said light to be measured.

9. The optical spectrometer according to claim 8 wherein:
   said optical waveguide further includes a ridged side amplifier channel and holographic transition element.

* * * * *